US 6,535,748 B1

(12) United States Patent
Vuorio et al.

(10) Patent No.: US 6,535,748 B1
(45) Date of Patent: Mar. 18, 2003

(54) WIRELESS COMMUNICATION TRANSCEIVER HAVING A DUAL MODE OF OPERATION

(75) Inventors: Juha Vuorio, Oulu (FI); Harri Lilja, Kimmontie (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/317,594

(22) Filed: May 24, 1999

(30) Foreign Application Priority Data

May 27, 1998 (GB) ............................................. 9811380

(51) Int. Cl.⁷ ............................. H04B 1/38; H04M 1/00
(52) U.S. Cl. ..................................... 455/552; 455/78
(58) Field of Search ............................. 455/552, 553, 455/78, 82, 83, 84, 179.1, 180.1, 188.1

(56) References Cited

U.S. PATENT DOCUMENTS

| | | | |
|---|---|---|---|
| 5,194,826 A | 3/1993 | Huusko | 330/302 |
| 5,257,257 A | 10/1993 | Chen et al. | 370/18 |
| 5,394,391 A | 2/1995 | Chen et al. | 370/18 |
| 5,416,435 A | 5/1995 | Jokinen et al. | 327/113 |
| 5,420,889 A | 5/1995 | Juntti | 375/346 |
| 5,426,670 A | 6/1995 | Leppanen et al. | 375/343 |
| 5,440,597 A | 8/1995 | Chung et al. | 375/200 |
| 5,491,718 A | 2/1996 | Gould et al. | 375/205 |
| 5,533,013 A | 7/1996 | Leppanen | 370/18 |
| 5,548,616 A | 8/1996 | Mucke et al. | 375/295 |
| 5,550,893 A | 8/1996 | Heidari | 379/59 |
| 5,566,201 A | 10/1996 | Ostman | 375/200 |
| 5,589,795 A | 12/1996 | Latva-Aho | 327/553 |
| 5,590,160 A | 12/1996 | Ostman | 375/367 |
| 5,596,571 A | 1/1997 | Gould et al. | 370/335 |
| 5,654,980 A | 8/1997 | Latva-Aho et al. | 375/208 |
| 5,703,873 A | 12/1997 | Ojanpera et al. | 370/332 |
| 5,715,279 A | 2/1998 | Laakso et al. | 375/224 |
| 5,768,691 A | * 6/1998 | Matero | 455/78 |
| 5,815,801 A | 9/1998 | Hamalainen et al. | 455/63 |
| 5,881,097 A | 3/1999 | Lilleberg et al. | 375/203 |
| 5,887,252 A | 3/1999 | Noneman | 455/414 |
| 5,905,946 A | 5/1999 | Lilleberg et al. | 55/63 |

FOREIGN PATENT DOCUMENTS

EP  0 751 631 A1  1/1997

OTHER PUBLICATIONS

United Kingdom Search Report.

* cited by examiner

Primary Examiner—Vivian Chin
Assistant Examiner—James K Moore
(74) Attorney, Agent, or Firm—Perman & Green, LLP (57) ABSTRACT

A transceiver for use in wireless communications including a first antenna and first filter coupled thereto to transmit signals in a first frequency range and a second antenna and second filter means coupled thereto to receive signals in the first frequency range or a second different frequency, in dependence on a mode of operation of the transceiver. In a first mode of operation the transceiver is arranged to transmit signals in the first frequency range via the first antenna and to receive signals in the second frequency range via the second antenna, and in a second mode of operation, the transceiver is arranged to receive signals in the first frequency range via the second antenna. Alternatively, the second antenna and second filter may receive signals in a third frequency range and in the second mode of operation, the transceiver is arranged to receive signals in the third frequency range via the second antenna.

29 Claims, 5 Drawing Sheets

Prior Art

Prior Art

Prior Art ms  Fig. 10a.  BTS

WIRELESS COMMUNICATION TRANSCEIVER HAVING A DUAL MODE OF OPERATION

FIELD OF THE INVENTION

The present invention relates to a transceiver for use in wireless communication. In particular, but not exclusively, the present invention relates to a transceiver that has a dual mode of operation where in the first mode of operation the signals received and the signals transmitted by the transceiver are in different frequency ranges and in the second mode of operation the received and transmitted signals are in the same frequency range.

BACKGROUND TO THE INVENTION

In most cellular telecommunication networks, mobile stations in a cell associated with a base transceiver station use a first frequency range to transmit signals to the base transceiver station. The base transceiver station uses a second, different, frequency range to transmit signals to the mobile stations in the cell associated with that base transceiver station. This is known as the frequency division duplex (FDD) mode of operation and has been used in analogue cellular telecommunication systems as well as in the current digital cellular telecommunications systems such as GSM.

Figure 10A:
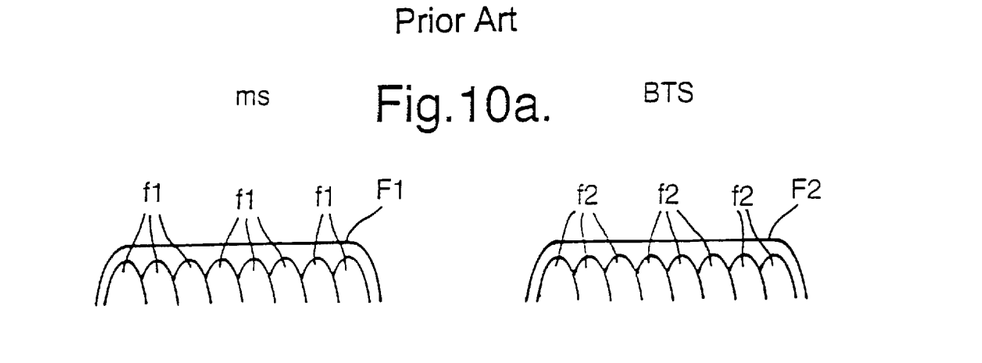
FIG. 10a shows the principle of a FDD mode of operation for a F/TDMA system.

Reference is made to FIG. 10a which illustrates the principle of FDD operation in a frequency division multiple access system. The first frequency range F1 is used to transmit signals from the mobile stations to the base station and the second frequency range F2 is used to transmit signals from the base station to the mobile stations. In practice each of the frequency ranges F1 and F2 are divided into a plurality of smaller frequency ranges f1 and f2 respectively. Thus a mobile station in a particular cell will be allocated one of the smaller frequency ranges f1 to communicate with the base station associated with the cell in which the mobile station is located. Likewise, the base station will be allocated one of the smaller frequency ranges f2 to communicate with the mobile station.

Figure 10B:
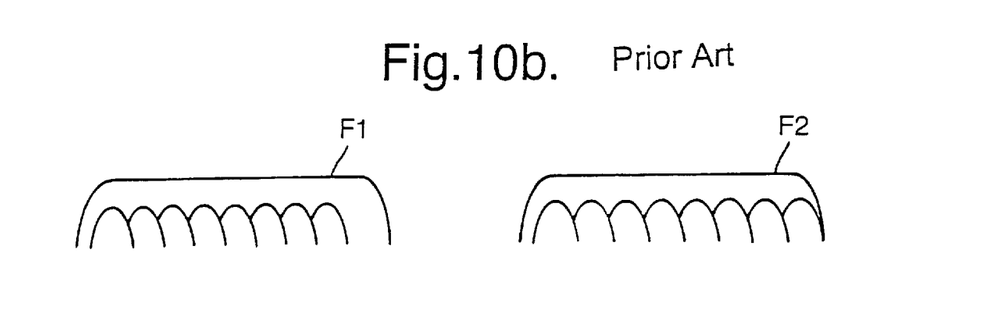
FIG. 10b shows a system using the FDD mode of operation for a CDMA mode of operation.
Figure 10C:
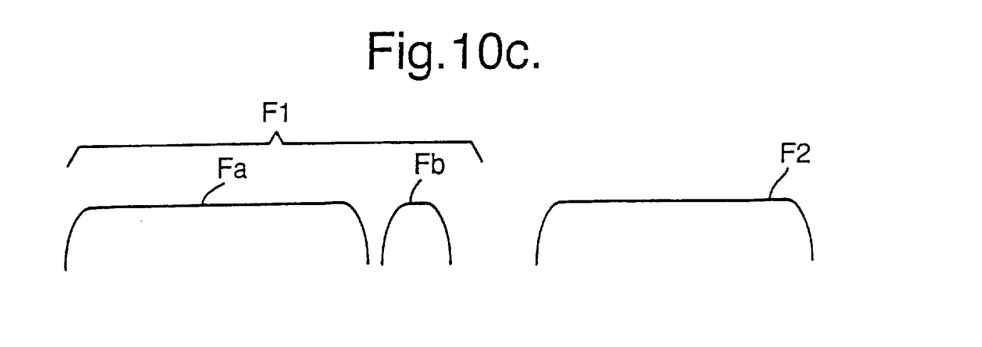
FIG. 10c shows one system using the FDD mode of operation and the TDD mode of operation.
Figure 10D:
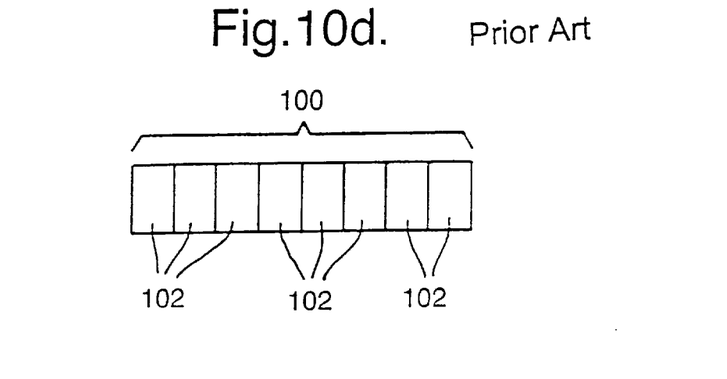

In a system such as the GSM system which uses time division multiple access (TDMA), each smaller frequency range is divided into a plurality of frames 100, one of which is shown in FIG. 10d. Each frame 100 comprises a plurality of time slots 102. The base station will be allocated a particular time slot 102 in successive frames to communicate with a given mobile station in one of the smaller frequency ranges f2. Likewise the mobile station will be allocated a particular time slot in successive frames to communicate with the base station in one of the smaller frequency ranges f1.

It has also been proposed that in some systems the base transceiver station can also use the same frequency range to communicate with a mobile station as the mobile station uses to communicate with the base station. This is known as the time division duplex (TDD) mode and is for example used in the DECT system. The frame and slot structure illustrated in FIG. 10d is also used. Thus in the TDD mode certain of the time slots in each frame will be allocated for use by the mobile stations to transmit signals to the base transceiver station. The remaining slots in each frame will be used by the base transceiver station to send signals to the mobile stations.

It has been proposed to have dual mode mobile stations which, for example can use both GSM and DECT modes of operation.

In the systems described hereinbefore which use time division multiple access, a mobile station will not receive and transmit signals at the same time. Accordingly, no consideration needs to be given to the isolation of the signals received and transmitted by the mobile station.

Another wireless communication access method is the code division multiple access (CDMA) method that also uses a first frequency range F1 for signals transmitted from mobile stations to the base transceiver station and a second frequency range F2 for signals transmitted from the base transceiver station to the mobile stations. The CDMA system like the above described FDMA/TDMA system in that, as shown in FIG. 10b, has the first and second frequency ranges divided into smaller frequency ranges. However the same frame and time slot structure is not used. Instead each signal is transmitted in one of the smaller frequency ranges and signals in the same smaller frequency range are distinguished by the spreading codes applied to the signals. In the CDMA method, the mobile station may receive and transmit signals at the same time. Accordingly, mobile stations which use the CDMA method have a duplex filter connected to the antenna. The duplex filter needs to have sufficient isolation to prevent the received signal from interfering with the signal to be transmitted and vice versa.

Figure 2:
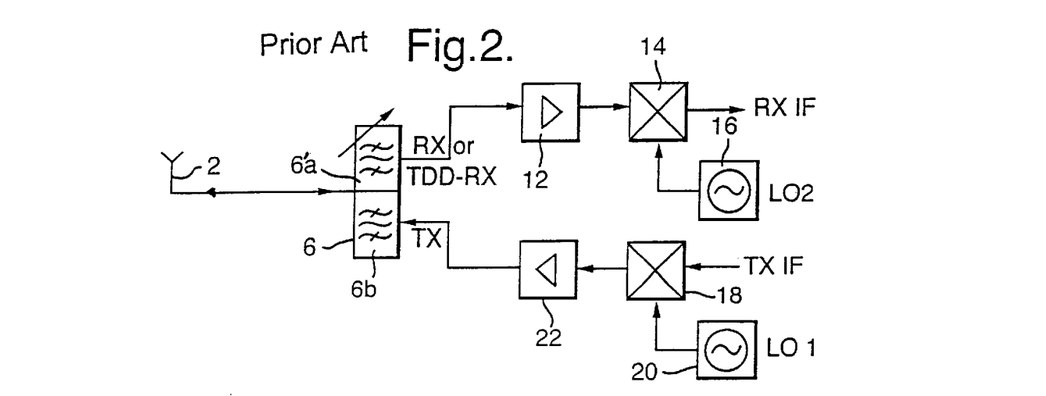
FIG. 2 shows a second proposed transceiver which supports a dual mode of operation.
Figure 3:
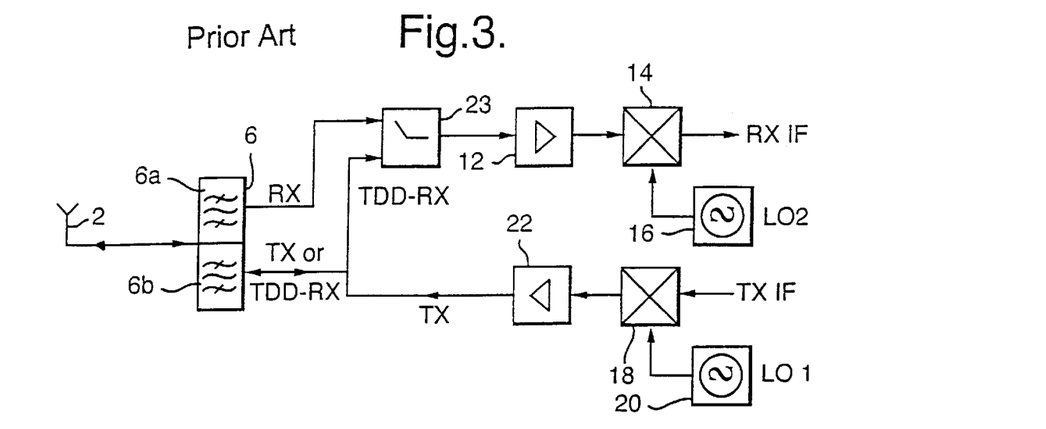
FIG. 3 shows a third proposed transceiver which supports a dual mode of operation.

Three different transceivers have been considered by the inventors for implementation of a mobile station which can operate in a FDD mode and a TDD mode and which can receive and transmit signals at the same time in the FDD mode of operation. In both modes of operation CDMA, TDMA or any other appropriate HIS method is used. It should be noted that these three transceivers, which are shown in FIGS. 1 to 3, do not constitute part of the state of the art.

Figure 1:
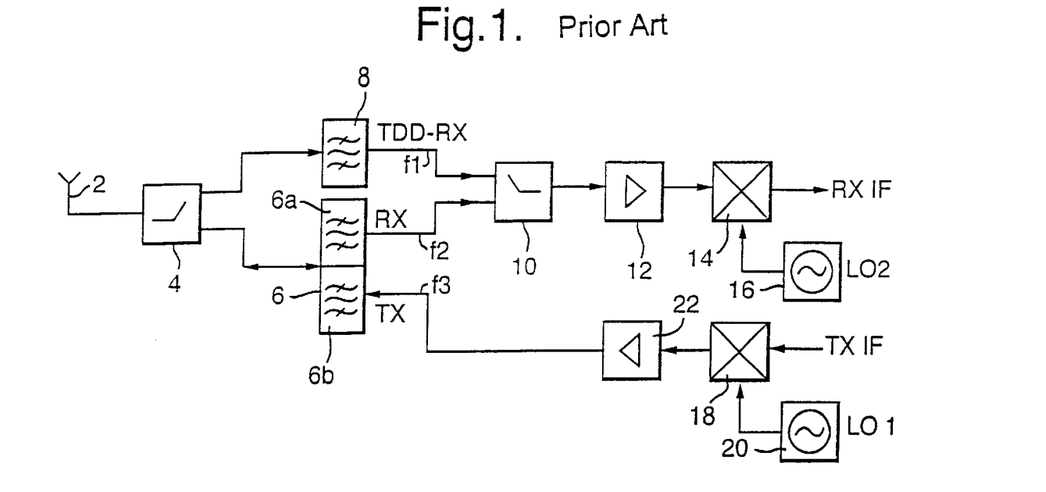
FIG. 1 shows a first proposed transceiver which supports a dual mode of operation.

A first one of these transceivers is shown in FIG. 1 and is now described in detail. An antenna 2 is arranged to receive signals and also to transmit signals. The antenna 2 is arranged to transmit signals in the frequency range F1 and to receive signals in the frequency ranges F2 and F1. The antenna 2 is connected to a switch 4 which selectively connects either a duplex filter 6 or a bandpass filter 8 to the antenna 2. The position of the switch 4 is dependent on the mode of operation and will be discussed in more detail hereinafter. The duplex filter 6 comprises a receive filter portion 6a which is tuned to frequency range F2 and a transmit filter portion 6b which is tuned to frequency range F1. The bandpass filter 8 is tuned to frequency F1. A switch 10 selectively connects the filter 8 or the receive filter portion 6a of the duplex filter 6 to a low noise amplifier 12. The output of the low noise amplifier 12 is connected to a mixer 14 which mixes the received signal with a signal from a high frequency synthesizer 16. The high frequency synthesizer 16 acts as a local oscillator. The output of the mixer 14 is at an intermediate frequency which is usually lower than the frequency of the signal which is received by the antenna 2. Other parts of the transceiver are known to those skilled in the art and will not be described.

In a similar manner, a signal to be transmitted is input at an intermediate frequency to a second mixer 18. The second mixer 18 also has an input from a second high frequency synthesizer 20 which again acts as a local oscillator. The output of the second mixer 18 represents the signal to be transmitted at the radio frequency and is in the frequency range F1. The radio frequency is the frequency at which the signal is transmitted across the channel to the base transceiver station. The output of the second mixer 18 is input to a power amplifier 22 which amplifies the signal. The output of the power amplifier 22 is received by the transmit portion 6b of the duplex filter 6 where the signal is filtered to remove undesired signal components and noise outside the frequency range F1.

The transceiver shown in FIG. 1 has two modes of operation. In the FDD mode of operation, the switch 4 connects the antenna 2 to the receive filter portion 6a of the duplex filter 6. The antenna 2 is not connected to the filter 8. The second switch 10 connects the receive portion 6a of the duplex filter 6 to the low noise amplifier 12. Thus, the signals received by the antenna 2 pass through the receive filter portion 6a of the duplex filter 6 to the low noise amplifier 12. From the low noise amplifier 12 the received signals are passed to the mixer 14.

In the FDD mode, the signals to be transmitted pass from the second mixer 18 to the power amplifier 22. The signals to be transmitted are then filtered by the transmit portion 6b of the duplex filter 6 and output to the antenna 2. The antenna 2 can, in this mode of operation, receive and transmit signals at the same time.

In the TDD mode of operation, the switches 4 and 10 are in the position shown in FIG. 1. The antenna 2 is connected to the bandpass filter 8 which in turn is connected via switch 10 to the low noise amplifier 12. The duplex filter 6 is not connected to the antenna 2 or to the low noise amplifier 12. In the TDD mode, the antenna 2 does not transmit and receive signals at the same time. The positions of the switch 4 will need to be altered if a signal is to be transmitted. Both the transmitted and the received signals will be in the frequency range F1.

This transceiver has the disadvantage that the two switches 4 and 10 both need to have good isolation. Typically, the total order of isolation needed for the switches is between 50 and 60 decibels. This isolation is required to prevent the signal which is transmitted in the FDD mode of operation from being partially fed through the bandpass filter 8 to the low noise amplifier 12, even when the switch 4 connects the antenna 2 to the duplex filter 6. If the signal to be transmitted reaches the low noise amplifier 12, because the first and second switches 4 and 10 do not have sufficient isolation to prevent this occurring, there could be interference between the signal which is to be transmitted in the frequency range F1 and the signal which should be received in the frequency range F2. If the part of the signal which is to be transmitted which reaches the low noise amplifier 12 has a much higher power level than the signal which should be received, the signal which should be received may be blocked. The information carried by the signal which should be received may therefore be lost or garbled.

This problem is compounded by the fact that the transmitted signal will have a much greater strength than the received signal. This problem could be avoided if the two switches 4 and 10 have sufficient isolation to prevent the feedback of the transmitted signal. Radio frequency switches having the required isolation to deal with this problem are both expensive and difficult to implement in practice.

Another problem associated with the transceiver shown in FIG. 1 is that the first switch 4 needs to have good linearity so as to avoid distorting the signal which is to be transmitted by the antenna 2. This further increases the costs associated with the first switch 4 as well as the difficulties associated with the implementation of that switch. In particular, it is difficult to implement a switch which has good isolation as well as good linearity.

FIG. 2 shows a second dual transceiver which has a FDD mode of operation and a TDD mode of operation. The FDD mode of operation may use CDMA whilst the TDD mode of operation may use TDMA or a CDMA/TDMA hybrid mode of operation. Those components which are the same as those of FIG. 1 are marked with the same reference numerals and will not be described again. The primary difference between the arrangement of FIG. 2 and that of FIG. 1 is that the duplex filter 6 comprises a tunable receive filter portion 6'a along with the transmit filter portion 6b. The transmit filter portion 6b is the same as that of the duplex filter 6 of FIG. 1.

In the FDD mode of operation, the receive filter portion 6'a is tuned to the frequency range F2. The transceiver is thus able to receive signals with a frequency in the range F2 and to transmit signals with a frequency in the range F1. In the TDD mode of operation, the receive filter portion 6'a is tuned to frequency F1. Thus, in the TDD mode of operation, signals are received and transmitted at frequency F1, although not at the same time. However, it is again difficult and expensive to implement a tunable duplex filter which has sufficient isolation to prevent at least a part of the signal to be transmitted, in the FDD mode, from reaching the low noise amplifier 12. For example, 50 to 60 decibels of isolation may be required. Isolation is an inherent problem with standard duplex filters but this problem is made worse if the duplex filter has a tunable filter portion.

A third transceiver is shown in FIG. 3. Those components which are the same as those shown in FIG. 1 are referenced by the same reference numerals and these components will not be described further. The antenna 2 is connected to a duplex filter 6 which has a receive filter portion 6a tuned to frequency range F2 and a transmit filter portion 6b which is tuned to frequency range F1. One switch 23 is provided. In the FDD mode of operation, the switch 23 is in the position shown in FIG. 3 and connects the receive filter portion 6a to the low noise amplifier 12. The received signals pass through the receive filter portion 6a, via switch 23, to the low noise amplifier 12. The signals to be transmitted pass from the power amplifier 22 to the transmit filter portion 6b of the duplex filter 6.

In the TDD mode of operation, the switch 23 connects the transmit filter portion 6b of the duplex filter 6 to the low noise amplifier 12 so that the received signals pass through the transmit filter portion 6b to the low noise amplifier 12. The disadvantage with this arrangement is that the switch 23 has to deal with radio frequency signals and provide good isolation, typically 50 to 60 decibels. In the FDD mode of operation, if the isolation provided by switch 23 is not sufficient, interference between the signal which is to be transmitted and the received signal may occur. This is a similar problem to that which occurs with the arrangement shown in FIG. 1. Additionally, the switch 23 also requires good linearity for the same reasons as outlined in relation to FIG. 1. It is difficult and expensive to implement a switch which has both the required linearity and the required isolation.

Figure 4:
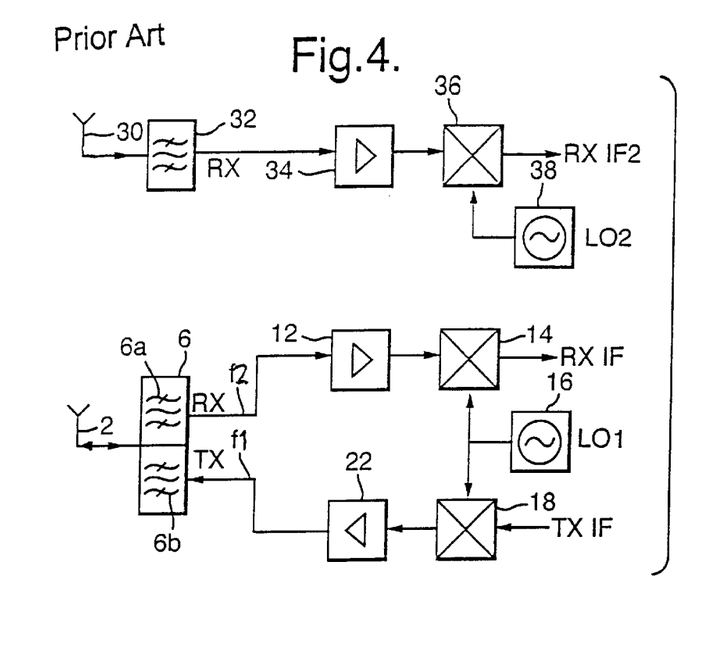
FIG. 4 shows a fourth transceiver which supports only a single mode of operation and which uses a maximum ratio combining space diversity technique.

In known CDMA and TDMA systems, to improve performance, the maximum ratio combining space diversity technique is sometimes used. A transceiver using this technique is shown in FIG. 4. This transceiver is used only in relation to single mode systems (FDD or TDD) and use of this transceiver with respect to dual mode mobile stations has not been contemplated. The components which are the same as those shown in FIGS. 1 to 3 are referred to by the same reference numerals. The arrangement shown in FIG. 4 comprises an antenna 2 connected to a duplex filter 6 having a receive filter portion 6a tuned to frequency range F2 and a transmit filter portion 6b tuned to frequency range F1. The output of the receive filter portion 6a of the duplex filter 6 is input to a low noise amplifier 12, the output of which is connected to a first mixer 14. The first mixer 14 receives an input from a high frequency synthesizer 16 so that the output of the mixer 14 represents the received signal at an intermediate frequency.

A path for the signal to be transmitted consists of a second a mixer 18 which also has an input from the first high frequency synthesizer 16, a power amplifier 22 and the transmit filter portion 6b of the duplex filter 6.

The transceiver of FIG. 4 comprises a second antenna 30 which is physically spaced apart from the first antenna 2. The second antenna 30 is used only to receive signals and is connected to a receive filter 32 which is tuned to frequency range F2. The output of the filter 32 is connected to a second low noise amplifier 34, the output of which is connected to a third mixer 36. The third mixer 36 has an input from a second high frequency synthesizer 38 so that the output of the third mixer 36 represents the received signal but at an intermediate frequency.

The second antenna 30 is used as a diversity receiver. For example, if the signal from a base station is not strongly received by antenna 2, it may be strongly received by antenna 30 and vice versa. This is due to the signals received by the first and second antenna following different paths from the base station to the mobile station. The signals received by antenna 2 and antenna 30 may be coherently combined using the maximum ratio combining technique, which gives a better performance, or, alternatively, the strongest signal selected. The combining of the signals or the selection of the strongest signal is carried out by components of the transceiver which are not shown in FIG. 4.

SUMMARY OF THE INVENTION

It is an aim of embodiments of the present invention to provide a transceiver which is able to support two modes of operation and which at least reduces the problems of the arrangements discussed hereinbefore. Preferably the two modes of operation are the TDD mode of operation and the FDD mode of operation.

According to one aspect of the present invention, there is provided a transceiver for use in wireless communications comprising: a first antenna and first filter means coupled ho thereto to transmit signals in a first frequency range; and a second antenna and second filter means coupled thereto to receive signals in the first frequency range or a second different frequency, in dependence on a mode of operation of the transceiver, whereby in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna.

As the signals are received and transmitted by different antennae the isolation required is reduced. This is because there will be a coupling loss between the antennae which then reduces the amount of isolation required. This coupling loss arises because the first and second antennae are physically spaced apart from one another.

Embodiments of the present invention may be used with any system which uses different frequency ranges for uplink and downlink communications.

The first mode of operation may be the FDD mode of operation whilst the second mode of operation may be the TDD mode of operation.

Whilst all signals may only be received by the second antenna and all signals only be transmitted by the first antenna, it is preferred that the first antenna and first filter means be arranged to receive, in the first mode of operation, signals in the second frequency range. It is preferable in this arrangement that signals only be transmitted via the first antenna.

Preferably, processing means process signals received by the first and second antennae in the first mode of operation to provide space diversity so that performance may be improved. The signals can be combined coherently or alternatively, the stronger of the signals received by the first and second antennae can be selected. The combining may be coherent combining such as maximum ratio combining. The signals which are received by the transceiver will typically travel via a number of different paths. This is known as the multipath effect. Any problems caused by a signal being attenuated due to the paths travelled by that signal can be reduced in that a signal travelling via an alternative paths which reaches the other antenna may be strong enough. Thus, embodiments of the present invention are able to provide both space diversity and also a transceiver which is able to operate in the FDD and TDD mode of operation but which does not suffer from the disadvantages of the arrangements discussed hereinbefore.

Preferably, the first filter means comprises a duplex filter having a first portion tuned to the first frequency range and a second portion tuned to the second frequency range whereby in use the signals to be transmitted are filtered by the first portion and the received signals are filtered by said second portion.

The second filter means may comprise a first filter tuned to the first frequency range and a second filter tuned to said second frequency range. Preferably switch means are arranged to couple the second antenna to the second filter in the first mode of operation and to couple the second antenna to the first filter in the second mode of operation. Due to the coupling loss between the first and second antenna, the switch means does not need to provide the same degree of isolation as required in the arrangements discussed hereinbefore. Accordingly, the switch means can be more easily and more cheaply implemented.

Alternatively, the second filter means may comprise a tunable filter which, in the first mode of operation is tuned to the second frequency range and in the first mode of operation is tuned to the first frequency range. Again, due to the coupling loss between the antennae, the degree of isolation which needs to be provided by the tunable filter is reduced and this tunable filter can be more easily implemented than in the known arrangement shown in FIG. 2.

Preferably, the output of the first and second filter means are coupled to respective amplifier means and mixer means. Preferably, in the first mode of operation, the transceiver is arranged to receive and transmit signals at the same time. However, in the second mode of operation, the transceiver may be arranged so that it does not receive and transmit signals at the same time. In the second mode of operation, the transceiver is preferably arranged to transmit signals via the first antenna in the first frequency range, the transceiver not transmitting and receiving signals at the same time in the second mode of operation.

The first frequency range may have a first part and a second part, whereby in the first mode of operation, said first antenna is arranged to transmit signals in the first part of the first frequency range and in the second mode of operation, said second antenna is arranged to receive signals in the second part of the first frequency range. Preferably the first antenna is arranged in the second mode of operation to transmit signals in the second part of the first frequency range.

Preferably, the transceiver is arranged to receive and transmit signals in the code division multiple access format, the time division multiple access format or any other suitable format. Thus, embodiments of the present invention can be used with any other spread spectrum or non-spread spectrum access technique. A mobile station preferably incorporates a transceiver such as described hereinbefore.

BRIEF DESCRIPTION OF THE DRAWINGS

For a better understanding of the present invention and as to how the same may be carried into effect, reference will now be made by way of example to the accompanying drawings in which:

FIG. 10d shows a frame structure used in the system of FIG. 10a.

DETAILED DESCRIPTION OF PREFERRED EMBODIMENTS OF THE INVENTION

Figure 5:
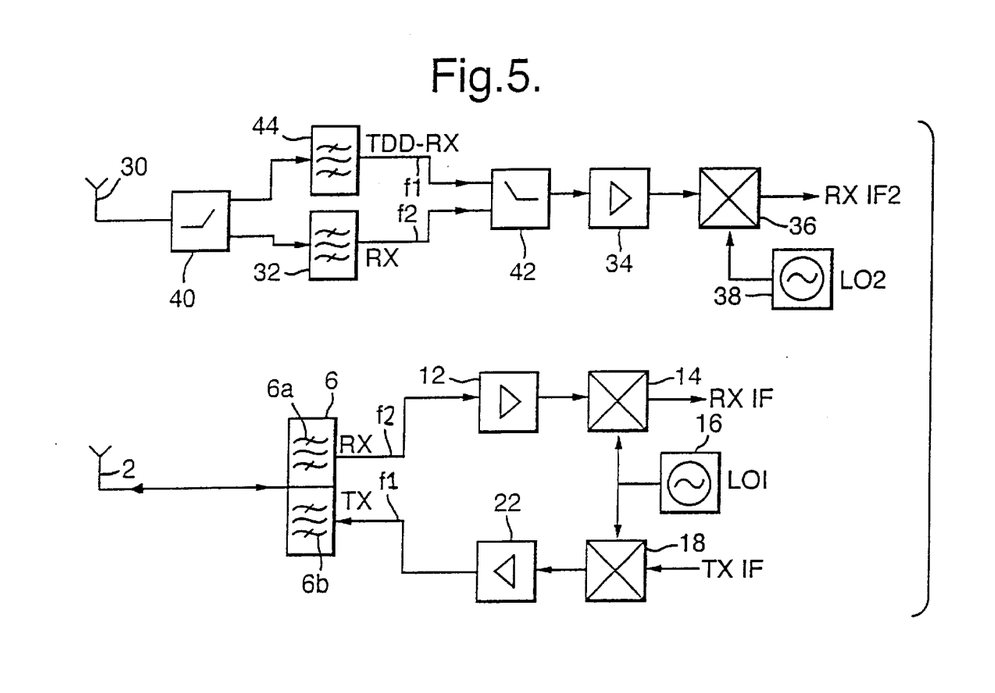
FIG. 5 shows a schematic view of a first embodiment of the present invention which supports a dual mode of operation.

Reference will now be made to FIG. 5 which shows a first embodiment of the present invention. It should be appreciated that those components are the same as shown in the previous Figures are referred to by the same reference numeral.

The arrangement shown in FIG. 5 has two modes of operation. Preferably the FDD mode of operation uses CDMA whilst the TDD mode of operation uses TDMA or a TDMA/CDMA hybrid mode of operation. In the FDD mode of operation, the first antenna 2 is arranged to transmit signals in the frequency range F1. It should be appreciated that signals will be sent in one of the channels within the first frequency range. The signal which is to be transmitted is input at an intermediate frequency to the second mixer 18. The second mixer 18 has an input from the first high frequency synthesizer 16 which generates a signal at a given frequency. The output of the second mixer 18 represents the signal to be transmitted at the radio frequency. The radio frequency signal is then is amplified by the power amplifier 22. The output of the power amplifier 22 passes through the transmit filter portion 6b of the duplex filter 6. The transmit filter portion 6b of the duplex filter 6 filters out unwanted frequencies including those in the receive frequency range F2.

In the FDD mode of operation, the first antenna 2 receives a signal, the desired part of which is in the radio frequency range F2. Likewise the signals will be received in one of the channels within the second frequency range. F1 and F2 define different, non-overlapping frequency ranges. The two frequency ranges may be spaced apart. The receive filter portion 6a will filter out any signal which falls outside the desired frequency range F2 including signals which are transmitted by the antenna in the frequency range F1. The received and filtered signal is input to the low noise amplifier 12 which amplifies the signal. The amplified signal is input it to the first mixer 14. The received signal is mixed by the first mixer 14 with a signal from the first synthesizer 16 to provide an output representing the received signal at an intermediate frequency.

Additionally, in the FDD mode of operation, the second antenna 30 is arranged to receive a signal at frequency F2. A first switch 40 is in a position so that the second antenna 30 is connected to a first receive filter 32. The first switch 40 is connected on one side to the second antenna 30 and on the other side either to the first receive filter 32 or to a second receive filter 44. The purpose of the second receive filter 44 will be discussed hereinafter. The first receive filter 32 filters the received signal to remove any components which are not in the frequency range F2. The first and second receive filters 32 and 44 are both bandpass filters.

A second switch 42 connects the output of first receive filter 32 to the second low noise amplifier 34. The second switch 42 is connected on one side either to the first receive filter 32 or the second receive filter 44 and on the other side to the second low noise amplifier 34. The output of the second low noise amplifier 34 is input to a third mixer 36 which receives an input from the second high frequency synthesizer 38. The third mixer 36 thus down converts the received signal from a radio frequency to an intermediate frequency so that the output of the third mixer 36 represents the received signal at an intermediate frequency. This intermediate frequency may be the same or different to the intermediate frequencies of the signal output from the first mixer 14 or the signal input to second mixer 18.

Thus, in the FDD mode of operation, the circuit shown in FIG. 5 will use a space diversity technique. The two antennae 2 and 30 are typically spaced apart by a distance corresponding to the size of the terminal. Generally, the greater the spacing between the antennae, the greater the benefit. The spacing may for example be equal to ½ to 1 wavelength. The same signal will be received by both of the antennae 2 and 30. However, the signals which are received by the two antennae may have followed different paths and therefore have different strengths and different multipath effects. The signals from the two antennae 2 and 30 may simply be combined coherently using maximum ratio combining or alternatively, the stronger of the two signals received by the two antennae 2 and 30 may be used with a weaker signal being discarded.

The FDD mode of operation allows signals to be received in the frequency range F2 and signals in the frequency range F1 to be transmitted. The signals can be received and transmitted at the same time. Additionally the signals to be received can be received by two spaced apart antennae, thereby giving space diversity to the received signals.

In the TDD mode of operation, the first switch 40 will be in the position shown in FIG. 5 and will connect the second antenna 30 to the second receive filter 44. The second receive filter 44 is tuned to the frequency range F1, that is the frequency used in the FDD mode of operation to transmit signals. The signal received by the second antenna 30 is filtered by the second receive filter 44 which removes any components which are not in the frequency range F1. The second switch 42 is in the position shown in FIG. 5 and connects the output of the second receive filter 44 to the input of the second low noise amplifier 34. The received signal is thus amplified. The output of the low noise amplifier 34 is connected to the third mixer 36 as in the FDD mode of operation. The received signal, at a radio frequency, is down converted to an intermediate frequency.

If the second synthesizer 38 only provides the same frequency as in the FDD mode of operation, then the intermediate frequency output from the third mixer 38 will be different in the FDD and TDD modes of operation. However the frequency output by the second synthesizer 38 may be alterable so that the output of the third mixer 36 be the same in both the FDD and the TDD modes of operation.

In the TDD mode of operation, signals will be received by the second antenna 30 in the frequency range F1. As the receive filter portion 6a of the duplex filter 6 connected to the first antenna is tuned to the frequency range F2, the received signal having the frequency F1 will be filtered out and thus removed by the receive filter portion 6a. In the TDD mode of operation, the signal to be received is only successfully received via the second antenna 30 with the second receive filter 44 tuned to frequency F1. In the TDD mode of operation any signals to be transmitted will, as in the first mode of operation, use the path defined by second mixer 18, the low noise amplifier 22 and the transmit filter portion 6b of the duplex filter 6. In the TDD mode of operation, signals will not be transmitted and received at the same time but the received and transmitted signals will be in the same frequency range F1.

In the TDD mode of operation, signals are received by the second antenna 30 and transmitted by the first antenna 2. In the FDD mode of operation, the signals are transmitted only by the first antenna 2 and the signals are received by both the first and the second antennae 2 and 30. As the two antennae are spaced apart, this gives rise to a coupling loss between those two antennae. Typically, this loss will be more than 30 dB. Accordingly, in the FDD mode of operation, the probability that at least a part of the signal to be transmitted will pass through the second receive filter 44 is reduced. The second receive filter 44 is bypassed in the FDD mode of operation. Accordingly, the isolation needed for the first and second switches 40 and 42 to avoid the signal to be transmitted blocking the signal to be received in the FDD mode of operation is much lower than in the arrangements shown in FIGS. 1 to 3. Additionally, as the first and second switches 40 and 42 are used in a part of the transceiver which just receives signals, the high linearity that would be required if the transmitted signal were to pass through the switches as in the arrangements shown in FIGS. 1 to 3 is also not required. The first and second radio frequency switches 40 and 42 thus require a lower amount of isolation and linearity as compared to the switches which would be required with the arrangements of FIGS. 1 to 3. This makes the switches 40 and 42 cheaper and easier to implement than those required for the arrangements of FIGS. 1 to 3. Additionally, the advantages of space diversity are also achieved with this arrangement, in the FDD mode of operation.

The embodiment described in FIG. 5 may use, as an alternative mode of operation, an asymmetric mode of operation in that the amount of information needed to be transmitted from the base station to the mobile station may exceed the amount of information which needs to be transmitted from the mobile station to the base station.

In the asymmetric mode, there are two channels allocated for the communication between a mobile station and a base station, one channel being in the second frequency range F2 and one channel being in the first frequency range F1. Because of the asymmetric mode between the uplink and downlink, the base station will continuously transmit in the allocated channel in the second frequency range F2. The mobile station will receive those signals in the second frequency range F2 via the first antenna 2. In the asymmetric mode, the allocated channel in the first frequency range F1 is configured to a TDD mode so that the mobile station transmits in this channel for only a proportion of the time, for example ⅛ of the time, via the first antenna 2 and for the rest of the time, for example the remaining ⅞'s of the time, the channel is used by the base station to transmit signals to the mobile station. The signals from the base station in the first frequency range F1 are received by the second antenna 30 of the mobile station. Thus, in the asymmetric mode, the mobile station receives for ⅞'s of the time two channels simultaneously from the base station, one channel being in the second frequency range F2 and being received by the first channel and the other channel being in the first frequency range F1 and being received via the second antenna. For ⅛ of the time, the mobile station will receive signals in the frequency range F2 via the first antenna and at the same time will transmit signals in the first frequency range F1 via the first antenna. The asymmetric mode effectively allows the base station to use some of the available channels in the first frequency range F1 in addition to channels in the second frequency range F2.

In one modification to the embodiment described in FIG. 5, in the TDD mode of operation, the second antenna 30 will receive signals in the first frequency range F1 and the first antenna 2 will, at the same time, receive signals in the second frequency range F2. Signals can, in the same or an alternative modification to the embodiment described in FIG. 5, be transmitted and received at the same time in the frequency range F1, provided that different frequency ranges within the frequency range F1 are used. For example, frequency ranges Fa and Fb shown in FIG. 10c and which are both in frequency range F1 could be used, one range for receiving and one range for transmitting. This is possible because two different antennae are used. It should be appreciated that these modifications are also applicable to the other embodiments described hereinafter.

Figure 6:
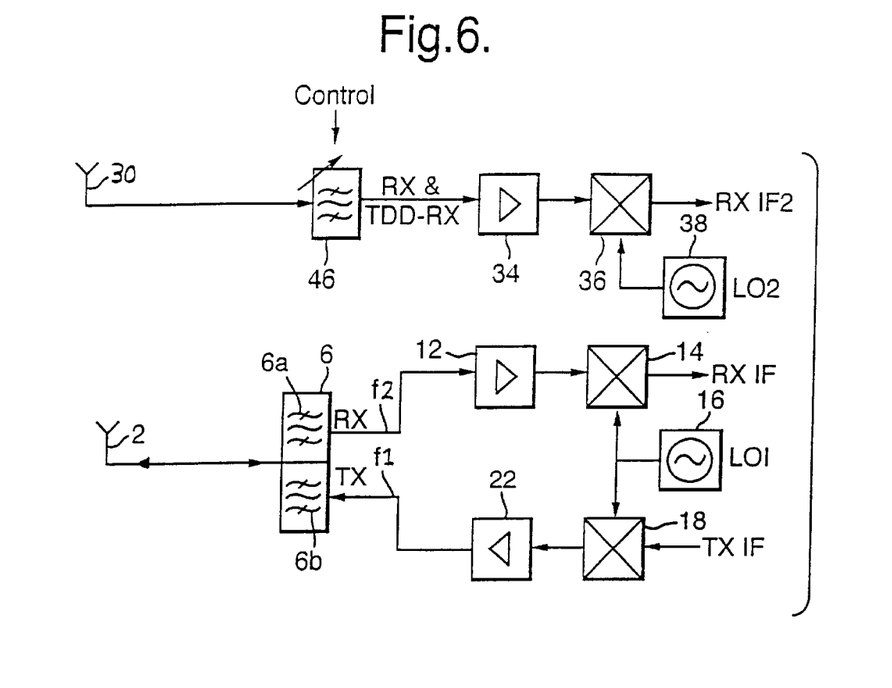
FIG. 6 shows a schematic view of a second embodiment of the present invention which supports a dual mode of operation.

Reference will now be made to FIG. 6 which shows a second embodiment of the present invention. The arrangement shown in FIG. 6 is the same as that shown in FIG. 5 except that the first and second switches 40 and 42 and the first and second receive filters 32 and 34 have been replaced by a tunable receiver filter 46 which can be tuned to the frequency range F1 or F2 depending on the mode of operation. In the FDD mode of operation, the tunable filter 46 will be tuned to the frequency range F2. Thus the same signal in the frequency range F2 is received via the first and second antennae 2 and 30 giving space diversity. The signals are transmitted via the first antenna 2 and are in the frequency range F1.

In the TDD mode of operation, the tunable filter 46 will be tuned to frequency F1, that is the frequency used in the FDD mode of operation for the transmitted signals. The tunable filter 46 has a control input which controls the frequency to which the filter 46 is tuned, in dependence on the mode of operation. The signals in the range F1 are successfully received only via the second antenna 30 and are transmitted in the same frequency range, but not at the same time, via the first antenna 2.

The tunable filter 46 shown in FIG. 6 does not suffer from the same problems which occur in the FDD mode of operation with the tunable duplex filter shown in FIG. 2. This is because the tunable receiver filter 46 is physically separated from the relevant part of the output path for the signal to be transmitted. The relevant part of the output path is defined by the transmit filter portion 6b of the duplex filter and the first antenna 2. This is a consequence of the first antenna 2 and the second antenna 30 being spaced apart. Accordingly, there is an inherent isolation between the tunable filter 46 and the relevant part of the output path for the signal to be transmitted. The difficulties caused, in the FDD mode, by the signal to be transmitted interfering with the received signal can be reduced or even avoided without the need for a significant amount of isolation for the tunable filter 46. Therefore, the isolation required by the tunable filter 46 is much less than that required by the duplex filter of FIG. 2. It is thus much easier and cheaper to implement the tunable filter of FIG. 6 as compared to that of FIG. 2.

The second embodiment can be modified in the same manner as described in relation to the first embodiment.

Figure 7:
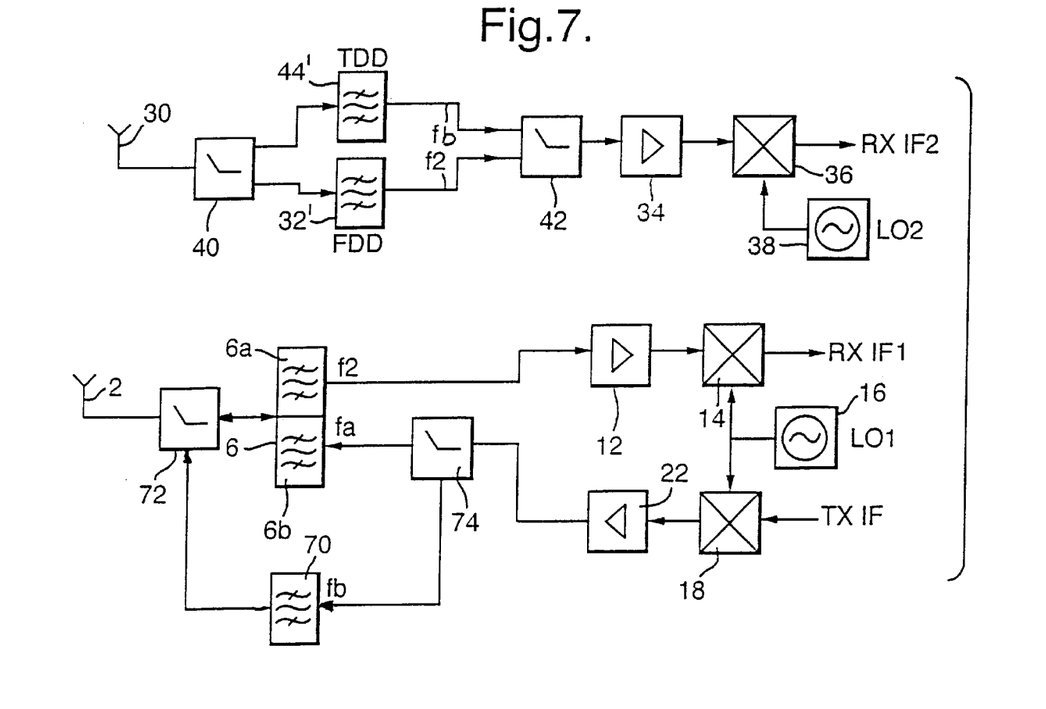
FIG. 7 shows a schematic view of a third embodiment of the present invention which supports a dual mode of operation.

Reference will now be made to FIG. 7 which shows a third embodiment of the present invention. Those components which are the same as shown in FIGS. 5 and 6 will not be described again and will be referenced by the same reference numerals. In this embodiment, the first frequency range F1 is divided into two parts as can be seen from FIG. 10c. In particular, the first part of the frequency range Fa is used to transmit signals from the mobile station to the base station in the FDD mode. The second part Fb of the first frequency range is used by the base station to transmit signals to the mobile station in the TDD mode of operation. Additionally this same frequency range Fb may be used by the mobile station in the TDD mode of operation to transmit signals to the base station. The base station uses the second frequency range F2 to transmit signals to the mobile station in the FDD mode of operation.

The components connected to the second antenna 30 in this embodiment are the generally the same as the components connected to the second antenna 30 in the first embodiment with the exception of the second receive filter 44'. In the embodiment shown in FIG. 7, the first receive filter 32' is tuned to frequency range F2 whilst the second receive filter 44' is tuned to the frequency range Fb. It should be noted that the components connected to the second antenna 30 in the embodiment shown in FIG. 7 operate in the same way as the components connected to the second antenna 30 in the embodiment shown in FIG. 5.

The components connected to the first antenna 2 differ from those of the first embodiment in that an additional filter 70 is provided with two additional switches 72 and 74. The first additional switch 72 connects the first antenna 2 to the additional filter 70 or the duplex filter 6. The second additional switch 74 connects either the additional filter 70 or the transmit portion 6b of the duplex filter 6 to the power amplifier 22. The additional filter 70 is a bandpass filter which is tuned to the frequency range Fb. The transmit portion 6b of the duplex filter 6 is tuned to the frequency range Fa.

In the FDD mode of operation, the second antenna 30 is connected to the first receive filter 32 to receive signals in the F2 frequency range. The first antenna 2 also receives signals in the frequency range F2 which are passed to the receive portion 6a of the duplex filter 6. Signals to be transmitted are in the frequency range Fa and pass from the output of the power amplifier 22 to the transmit portion 6b of the duplex filter 6 which is tuned to the frequency range Fa. Those signals are then transmitted by the first antenna 2.

In the TDD mode of operation, the second antenna 30 is connected to the second receive filter 44' to receive signals in the frequency range Fb. The first antenna 2 is arranged so that signals to be transmitted are output from the power amplifier 22 to the additional filter 70 and are then transmitted by the first antenna 2.

As with the embodiment shown in FIG. 6, the first and second receive filters 32 and 44' can be replaced by a tunable filter.

One advantage of the embodiment shown in FIG. 7 is that the additional switches 72 and 74 require less isolation in the FDD mode than those of the arrangements shown in FIGS. 1 to 3. This is because of the different frequency range used in the TDD mode as compared to the FDD mode. The filter 70 attenuates, in the FDD mode, the transmitted signal noise in the F2 frequency range leaking via this bypass path to the antenna so that any feedback interference is tolerable. Whilst the additional switches 72 and 74 should be linear, the implementation of these switches is not difficult as the isolation which these switches need to provide is much lower than with the arrangements illustrated in FIGS. 1 to 3.

Figure 8:
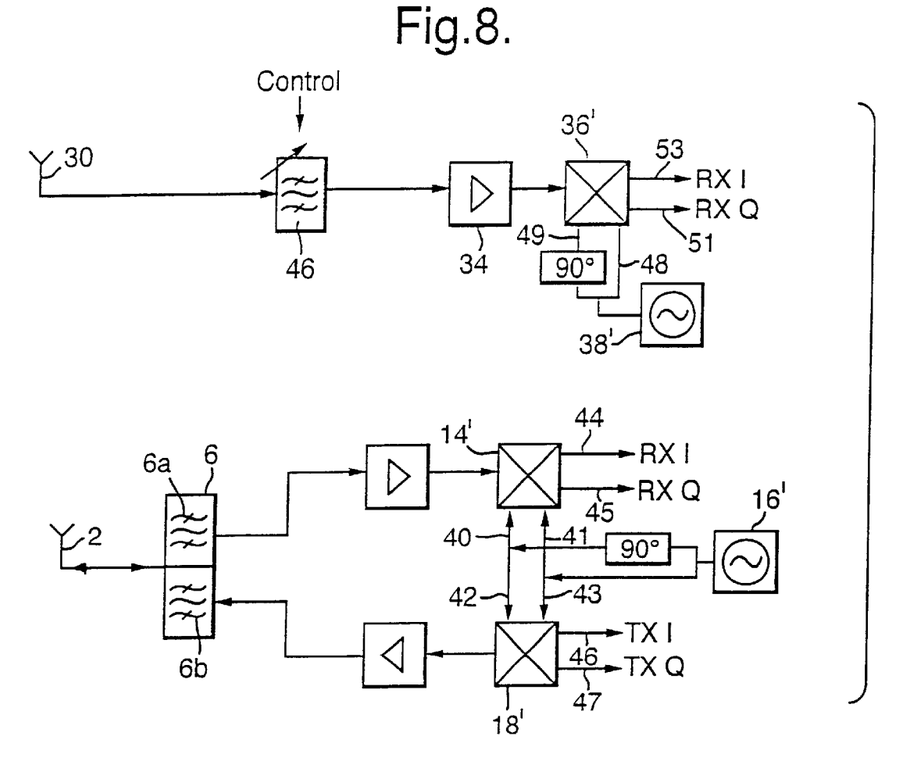
FIG. 8 shows a schematic view of a fourth embodiment of the present invention which supports a dual mode of operation and which uses direct conversion.

A fourth embodiment of the present invention is shown in FIG. 8. FIG. 8 is similar to the embodiment shown in FIG. 6. However, instead of converting the received signals to an intermediate frequency, the received signals are converted directly to a baseband frequency. With the arrangement shown in FIG. 6 (and FIGS. 5 and 7), it is necessary to down convert the received signals to the intermediate frequency and again from the intermediate frequency to a base band frequency. In the arrangement shown in FIG. 8, the received signals are down converted from the radio frequency to the base band I and Q frequencies in a single step and the transmitted signals are converted from the base band I and Q frequencies to the radio frequency in one step. In other words, no intermediate frequency is used.

It is common in wireless communication to represent signals in I and Q format, that is a quadrature (sine and cosine) representation of the data stream is produced. This quadrature representation is a modulated signal comprising sine and cosine parts and is up converted to produce a signal either at an intermediate frequency or at the radio frequency. Accordingly, with the received signal, if it is converted from the radio frequency straight to the base band I and Q frequencies, it is necessary at the same time to re-generate the sine and cosine components. To achieve this, the first mixer 14' and the third mixer 36' are quadrature mixers and each comprise two mixers, one for the I component and one for the Q component. The first and third mixers 14' and 36' each have two inputs 40, 41, 48 and 49 from the first and second synthesizers 16' and 38' respectively. One of the outputs of the first and second synthesizers 16' and 38' will be 90° out of phase with respect to the other output. The respective first and third mixers 14' and 36' therefore receive two signals, at the same frequency but 90° out of phase with respect to each other from the respective synthesizers 16' and 38'. A separate output 44, 45, 51, 53 is generated by the respective mixers 14' and 36' using a different one of the synthesizer inputs 48, 49, 40, 41. One 44 and 53 of the two outputs of each mixer 14' and 36' represents the sine component of the received signal at the base band frequency whilst the second output 45 and 51 of each mixer 14' and 36' represents the cosine part of the received signal at the base band frequency.

The sine and cosine components of the received signals will be subsequently demodulated by a demodulator (not shown).

Similarly, with the transmitted signal, it is necessary to combine the sine and cosine parts of the signal to be transmitted which are at the base band frequency. Accordingly, the sine and cosine (I and Q) components are each input via separate inputs 46 and 47 to the second mixer, which is a quadrature mixer, along with two inputs 42 and 43 from the first synthesizer 16'. Again, the two inputs 42 and 43 from the synthesizer 16' are 90° out of phase with respect to one another. The output of the mixer 18' provides the signal to be transmitted at the radio frequency with the sine and cosine components combined into a single signal. The signal will be in the frequency range F1.

It should be appreciated that the embodiments shown in FIGS. 5, 6 and 7 can be similarly modified in order to achieve direct down conversion i.e. a conversion of the received signal directly to the base band frequency and a conversion of the signal to be transmitted from the base band frequency directly to the radio frequency.

It is also possible that only one or both of the receive signals is directly converted to the baseband frequency with the transmit signal being converted to an intermediate frequency. Likewise the transmit signal may be directly converted from the baseband frequency to the radio frequency with one or both of the receive signals being down converted to an intermediate frequency.

In one modification to embodiments of the present invention, the TDD mode may be used in an adhoc networking mode where the mobile stations communicate directly with one another and not via base stations. This modification may be used in wireless local area networks (LANs). Alternatively, the FDD may also be used for the direct communication between terminals without using any base station.

In one modification to the embodiments shown in FIGS. 5 to 8, the first antenna is arranged only to transmit signals in the frequency range F1. The first antenna is thus arranged so that it does not receive any signals. The second antenna is arranged only to receive signals either in the frequency range F1 or in frequency range F2, in dependence on the mode of operation. This modification avoids the difficulties of the arrangements shown in FIGS. 1 to 3. Further the duplex filter and the components associated with the receive part of the duplex filter can be omitted.

The arrangements shown in FIGS. 5, 6 and 8 can be modified in order to be used in a dual FDD and TDD mode transceiver in accordance with the principles shown in FIG. 10*d* and used in the embodiment shown in FIG. 7.

Figure 9:
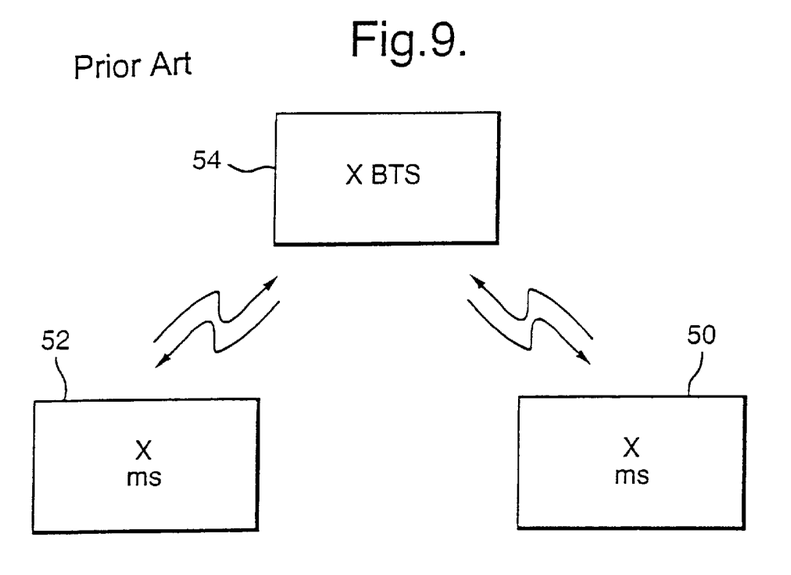
FIG. 9 shows a schematic view of part of a cellular telecommunications network in which embodiments of the present invention can be used.

Reference is made to FIG. 9 which shows part of a typical cellular communications network in which embodiments of the present invention can be used. A mobile station 50 or 52 is arranged to communicate with a base station 54 which serves the cell in which the two mobile stations 50 and 52 are arranged. In one modification a single mobile station may communicate with more than one base station. The mobile station may communicate with the FDD mode of operation with one base station and with the TDD mode of operation with the other base station. In another modification to the present invention, the communication may, for example, occur directly between two mobile stations and not via a base transceiver station. It should be appreciated that a base transceiver station which is arranged to operate in the TDD mode as well as the FDD mode may be different from a base transceiver station which is arranged to operate in only the FDD mode.

It should be appreciated that FDD and TDD systems may be different and use, for example different multiple access methods, different modulation methods, different modulation bandwidths, etc.

Whilst embodiments of the present invention have been described in the context of communications using TDMA and CDMA systems, embodiments of the present invention are also applicable to other types of spread spectrum communications and non spread spectrum methods of communication. Embodiments of the present invention are particularly applicable to dual mode FDD and TDD mode devices which require in, at least one mode of operation, the simultaneous receiving and transmitting of signals. The same or different access methods may be used in the different modes of operation. Embodiments of the present invention can also be included in devices other than mobile stations. For example base stations or fixed stations may incorporate the present invention.

What is claimed is:

1. A transceiver for use in wireless communications comprising:
   a first antenna and first filter means coupled thereto to transmit signals in a first frequency range; and
   a second antenna and second filter means coupled thereto to receive signals in the first frequency range or a second different frequency, in dependence on a mode of operation of the transceiver, wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna.

2. A transceiver as claimed in claim 1 wherein the transceiver is arranged to receive and transmit signals in the code division multiple access format.

3. A mobile station including a transceiver as claimed in claim 1.

4. A transceiver for use in wireless communications comprising:
   a first antenna and first filter means coupled thereto to transmit signals in a first frequency range; and
   a second antenna and second filter means coupled thereto to receive signals in the first frequency range or a second different frequency, in dependence on a mode of operation of the transceiver, wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna; and
   wherein the first antenna and first filter means are arranged to receive signals in a second frequency range.

5. A transceiver as claimed in claim 4, wherein processing means process the signals received by said first antenna and said second antenna in the first mode of operation to provide space diversity.

6. A transceiver as claimed in claim 4 wherein said first filter means comprises a duplex filter having a first portion tuned to the first frequency range and a second portion tuned to the second frequency range whereby in use, the signals to be transmitted are filtered by said first portion and the received signals are filtered by said second portion.

7. A transceiver as claimed in claim 4, wherein said second filter means comprises a first filter tuned to said first frequency range and a second filter tuned to said second frequency range.

8. A transceiver as claimed in claim 7, wherein switch means are arranged to couple the second antenna to the second filter in the first mode of operation and to couple the second antenna to the first filter in the second mode of operation.

9. A transceiver as claimed in claim 4, wherein said second filter means comprises a tunable filter which, in the first mode of operation is tuned to the second frequency range and in the second mode of operation is tuned to the first frequency range.

10. A transceiver as claimed in claim 4, wherein the output of the first and second filter means are coupled to respective amplifier means and mixer means.

11. A transceiver as claimed in claim 4, wherein in the first mode of operation the transceiver is arranged to receive and transmit signals at the same time.

12. A transceiver as claimed in claim 4, wherein in the second mode of operation the transceiver is arranged to transmit signals via the first antenna in the first frequency range, the transceiver not transmitting and receiving signals at the same time in said second mode of operation.

13. A transceiver as claimed in claim 4, wherein said first frequency range has a first part and a second part, whereby in the first mode of operation, said first antenna is arranged to transmit signals in the first part of the first frequency range and in the second mode of operation, said second antenna is arranged to receive signals in the second part of the first frequency range.

14. A transceiver as claimed in claim 13, wherein the first antenna is arranged in the second mode of operation to transmit signals in the second part of the first frequency range.

15. A transceiver as claimed in claim 4, wherein the transceiver is arranged only to transmit signals via the first antenna and to receive signals only via the second antenna.

16. A transceiver as claimed in claim 15, wherein the signals to be transmitted are in a first frequency range and the signals to be received are either in the first frequency range or in the second, different frequency range.

17. A transceiver for use in wireless communications comprising:
 a first antenna and first filter means coupled thereto to transmit signals in a first frequency range; and
 a second antenna and second filter means coupled thereto to receive, in dependence on a mode of operation of the transceiver, signals in a second, different frequency range or a third frequency range,
  wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the third frequency range via the second antenna.

18. A transceiver as claimed in claim 17, wherein the third frequency range is the same as or included in the first frequency range.

19. A transceiver as claimed in claim 17, wherein the third frequency range is different from the first and the second frequency ranges.

20. A transceiver as claimed in claim 17 wherein in the second mode of operation, the transceiver is arranged to transmit signals in the third frequency range via said first antenna.

21. A transceiver for use in wireless communications comprising:
 a first antenna and first filter means coupled thereto to transmit signals in a first frequency range; and
 a second antenna and second filter means coupled thereto to receive signals in the first frequency range or a second different frequency, in dependence on a mode of operation of the transceiver, wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna,
  wherein said second filter means comprises a first filter tuned to said first frequency range and a second filter tuned to said second frequency range.

22. A transceiver as claimed in claim 21, wherein switch means are arranged to couple the second antenna to the second filter in the first mode of operation and to couple the a second antenna to the first filter in the second mode of operation.

23. A transceiver for use in wireless communications comprising:
 a first antenna an first filter means coupled thereto to transmit signals in a first frequency range; and
 a second antenna and second filter means coupled thereto to receive signals in the first frequency range or a second different frequency, in dependence on a mode of operation of the transceiver, wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna,
  wherein said second filter means comprises a tunable filter which, in the first mode of operation is tuned to the second frequency range and in the second mode of operation is tuned to the first frequency range.

24. A transceiver for use in wireless communications comprising:
 a first antenna and first filter means coupled thereto to transmit signals in a first frequency range; and
 a second antenna and second filter means coupled thereto to receive signals in the first frequency range or a second different frequency, in dependence on a mode of operation of the transceiver,
 wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna,
 wherein in the first mode of operation the transceiver is arranged to receive and transmit signals at the same time.

25. A transceiver for use in wireless communications comprising:

a first antenna and first filter means coupled thereto to transmit signals in a first frequency range; and a second antenna and second filter means coupled thereto to receive signals in the first frequency range or a second different frequency, in dependence on a mode of operation of the transceiver, wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna, wherein in the second mode of operation the transceiver is arranged to transmit signals via the first antenna in the first frequency range, the transceiver not transmitting and receiving signals at the same time in said second mode of operation.

26. A transceiver for use in wireless communications comprising:

a first antenna and first filter means coupled thereto to transmit signals in a first frequency range; and a second antenna and second filter means coupled thereto to receive signals in the first frequency range or a second different frequency, in dependence on a mode of operation of the transceiver, wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna, wherein said first frequency range has a first part and a second part, whereby in the first mode of operation, said first antenna is arranged to transmit signals in the first part of the first frequency range and in the second mode of operation, said second antenna is arranged to receive signals in the second part of the first frequency range.

27. A transceiver as claimed in claim 26, wherein the first antenna is arranged in the second mode of operation to transmit signals in the second part of the first frequency range.

28. A transceiver for use in wireless communications comprising:

a first antenna and first filter means coupled thereto to transmit signals in a first frequency range; and a second antenna and second filter means coupled thereto to receive signals in the first frequency range or a second different frequency, in dependence on a mode of operation of the transceiver, wherein in a first mode of operation of the transceiver, the transceiver is arranged to transmit signals in the first frequency range via the first antenna and to receive signals in the second frequency range via the second antenna and in a second mode of operation, the transceiver is arranged to receive signals in the first frequency range via the second antenna, wherein the transceiver is arranged only to transmit signals via the first antenna and to receive signals only via the second antenna.

29. A transceiver as claimed in claim 28, wherein the signals to be transmitted are in a first frequency range and the signals to be received are either in the first frequency range or in the second, different frequency range.

* * * * *